(12) United States Patent
Nakahara et al.

(10) Patent No.: US 10,927,457 B2
(45) Date of Patent: Feb. 23, 2021

(54) SEMICONDUCTOR MANUFACTURING APPARATUS

(71) Applicant: Toshiba Memory Corporation, Minato-ku (JP)

(72) Inventors: Koji Nakahara, Inabe (JP); Kazuhiro Matsuo, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 561 days.

(21) Appl. No.: 14/847,487

(22) Filed: Sep. 8, 2015

(65) Prior Publication Data

US 2016/0258058 A1    Sep. 8, 2016

Related U.S. Application Data

(60) Provisional application No. 62/128,095, filed on Mar. 4, 2015.

(51) Int. Cl.
| | | |
|---|---|---|
| *C23C 16/44* | (2006.01) |
| *B01D 50/00* | (2006.01) |
| *F23J 15/02* | (2006.01) |
| *B01D 29/48* | (2006.01) |
| *B01D 47/10* | (2006.01) |
| *B01D 29/23* | (2006.01) |

(52) U.S. Cl.
CPC .......... *C23C 16/4412* (2013.01); *B01D 50/00* (2013.01); *F23J 15/022* (2013.01); *B01D 29/23* (2013.01); *B01D 29/48* (2013.01); *B01D 47/10* (2013.01)

(58) Field of Classification Search
CPC .... C23C 16/4412; B01D 29/46; B01D 29/48; B01D 29/50
See application file for complete search history.

(56) References Cited

U.S. PATENT DOCUMENTS

| | | | | |
|---|---|---|---|---|
| 3,747,347 A | * | 7/1973 | Ciraolo | ........... F01N 3/005 60/309 |
| 4,334,897 A | * | 6/1982 | Brady | ........... B01D 53/18 96/356 |
| 5,141,714 A | * | 8/1992 | Obuchi | ........... B01D 39/20 422/169 |
| 6,197,119 B1 | | 3/2001 | Dozoretz et al. | |

(Continued)

FOREIGN PATENT DOCUMENTS

| | | |
|---|---|---|
| JP | 02-025573 | 1/1990 |
| JP | 07-335568 | 12/1995 |

(Continued)

*Primary Examiner* — Karla A Moore
*Assistant Examiner* — Margaret D Klunk
(74) *Attorney, Agent, or Firm* — Oblon, McClelland, Maier & Neustadt, L.L.P.

(57) ABSTRACT

A semiconductor manufacturing apparatus in this embodiment includes a reactor, a pump, an exhaust pipe and a mesh member. The reactor houses a semiconductor substrate to treat the semiconductor substrate. The pump exhausts a gas inside the reactor. The exhaust pipe connects between the reactor and the pump. The mesh member is located at a flow inlet of the pump for the gas or in the exhaust pipe and has a main plane having a plurality of meshes arranged thereon. The mesh member has a protrusion and/or protruding shape projecting upstream of the gas.

2 Claims, 10 Drawing Sheets

(56) References Cited

U.S. PATENT DOCUMENTS

| | | | |
|---|---|---|---|
| 6,764,532 B1* | 7/2004 | Cheng | B01D 46/0024 |
| | | | 428/179 |
| 9,675,933 B2* | 6/2017 | Stuhler | B01D 53/75 |
| 2005/0000201 A1 | 1/2005 | Tanaka et al. | |
| 2008/0209898 A1* | 9/2008 | Succi | B01D 45/08 |
| | | | 60/311 |
| 2010/0166630 A1* | 7/2010 | Gu | B01D 53/76 |
| | | | 423/215.5 |
| 2011/0146254 A1* | 6/2011 | Yi | B01F 5/0616 |
| | | | 60/310 |

FOREIGN PATENT DOCUMENTS

| | | |
|---|---|---|
| JP | 2002-537644 | 11/2002 |
| JP | 2003-53101 A | 2/2003 |

* cited by examiner

SEMICONDUCTOR MANUFACTURING APPARATUS

CROSS REFERENCE TO RELATED APPLICATIONS

This application is based upon and claims the benefit of priority from the prior U.S. Provisional Patent Application No. 62/128,095 filed on Mar. 4, 2015, the entire contents of which are incorporated herein by reference.

FIELD

The present embodiment relates to a semiconductor manufacturing apparatus.

BACKGROUND

A shift to large diameter wafers (surface area expansion) has been advanced in order to increase the number of chips obtained from one wafer to improve productivity of the chips. Securing uniformity of film thickness within a wafer plane in a large diameter wafer (hereinafter, also referred to as in-plane uniformity) requires increase in a feed amount of a source gas for a wafer on film formation in a reacting furnace.

However, if the feed amount of the source gas increases, the amount of by-products which adhere on an inner side of an exhaust pipe increases, and thus, the by-products peeled off from the exhaust pipe are sucked together with the gas by a pump for exhaust with increasing frequency. Sucking by the pump for exhaust of a by-product having a large size, of the by-product peeled off from the exhaust pipe, considerably raises a load on the pump, and when the load on the pump reaches the upper limit, an interlock function of the pump is activated to stop the pump once. The pump once stopped is considerably lowered in an exhaust capability (exhausted amount, exhaust velocity) even after returning to operation.

Therefore, the surface area expansion of a semiconductor substrate, the securement of the in-plane uniformity, and improvement in the exhaust capability of the pump are all required to be achieved.

DETAILED DESCRIPTION

According to an embodiment, a semiconductor manufacturing apparatus includes a reactor, a pump, an exhaust pipe and a mesh member. The reactor houses a semiconductor substrate to treat the semiconductor substrate. The pump exhausts a gas inside the reactor. The exhaust pipe connects between the reactor and the pump. The mesh member is located at a flow inlet of the pump for the gas, or in the exhaust pipe, and has a main plane having a plurality of meshes arranged thereon. The mesh member has a protrusion and/or protruding shape projecting upstream of the gas.

Embodiments will now be explained with reference to the accompanying drawings. The present invention is not limited to the embodiments.

First Embodiment

First, as a first embodiment, a description is given of an embodiment of a semiconductor manufacturing apparatus which includes the mesh member having the protrusion.

Figure 1:
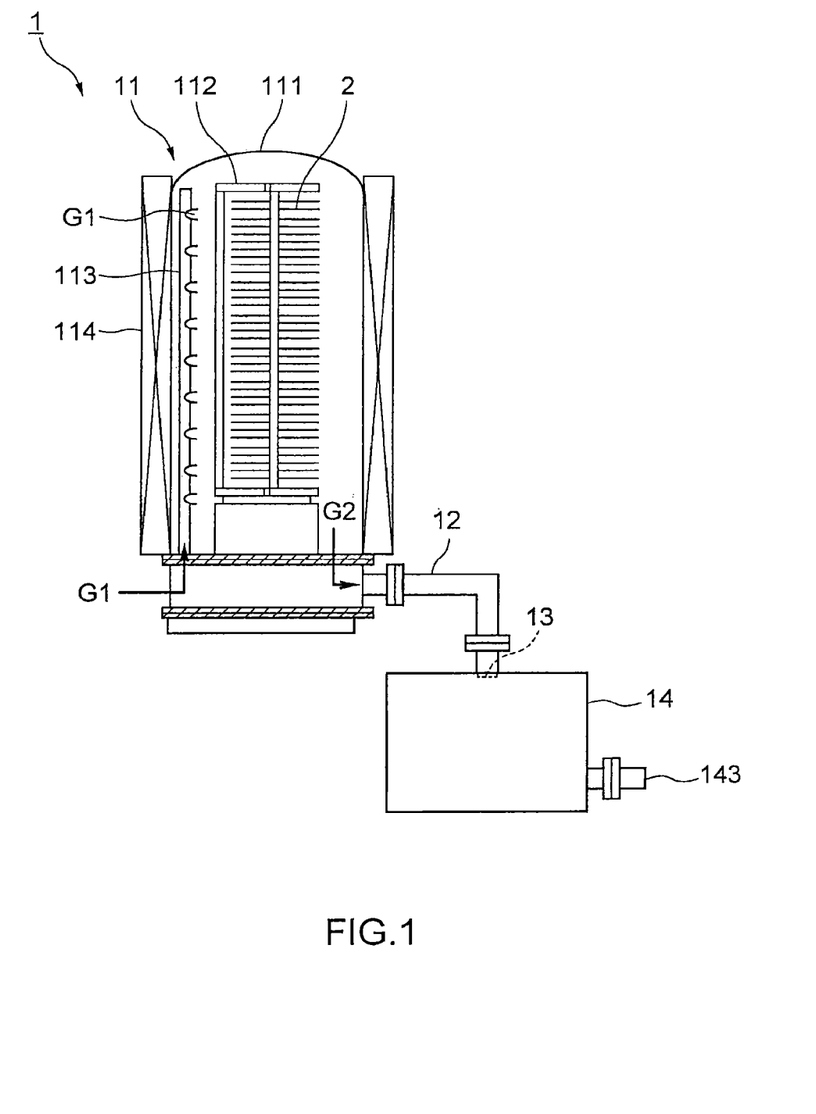
FIG. 1 is a schematic view of a semiconductor manufacturing apparatus 1 showing a first embodiment.
Figure 2:
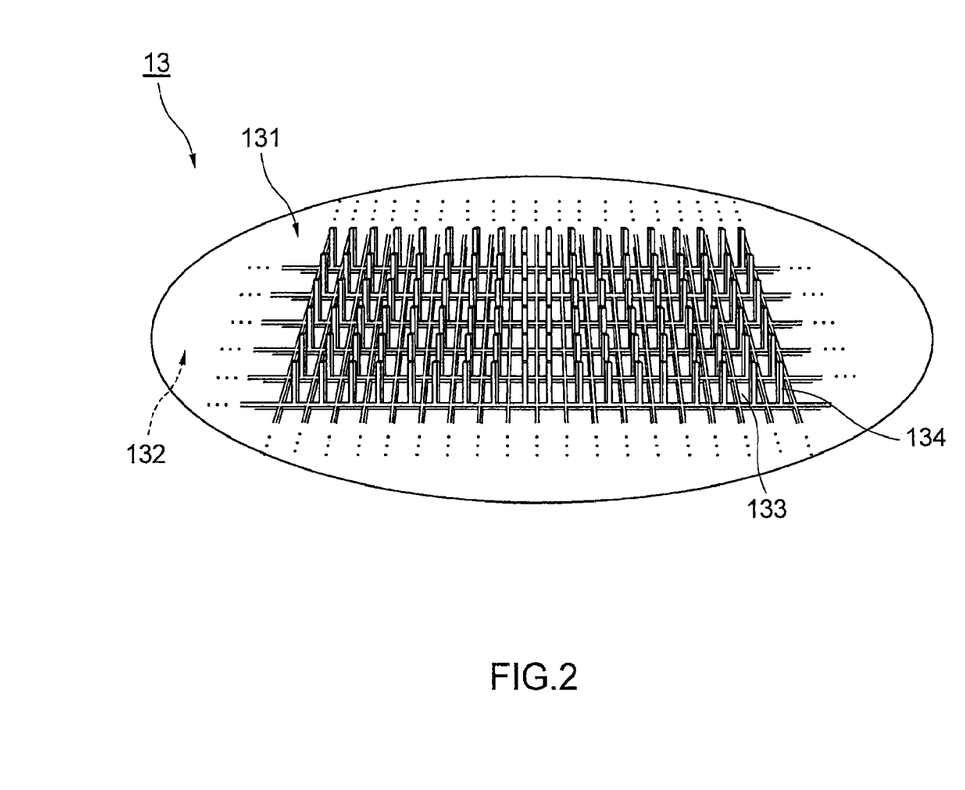
FIG. 2 is a schematic perspective view of a mesh member 13 of the semiconductor manufacturing apparatus 1 in FIG. 1.
Figure 3:
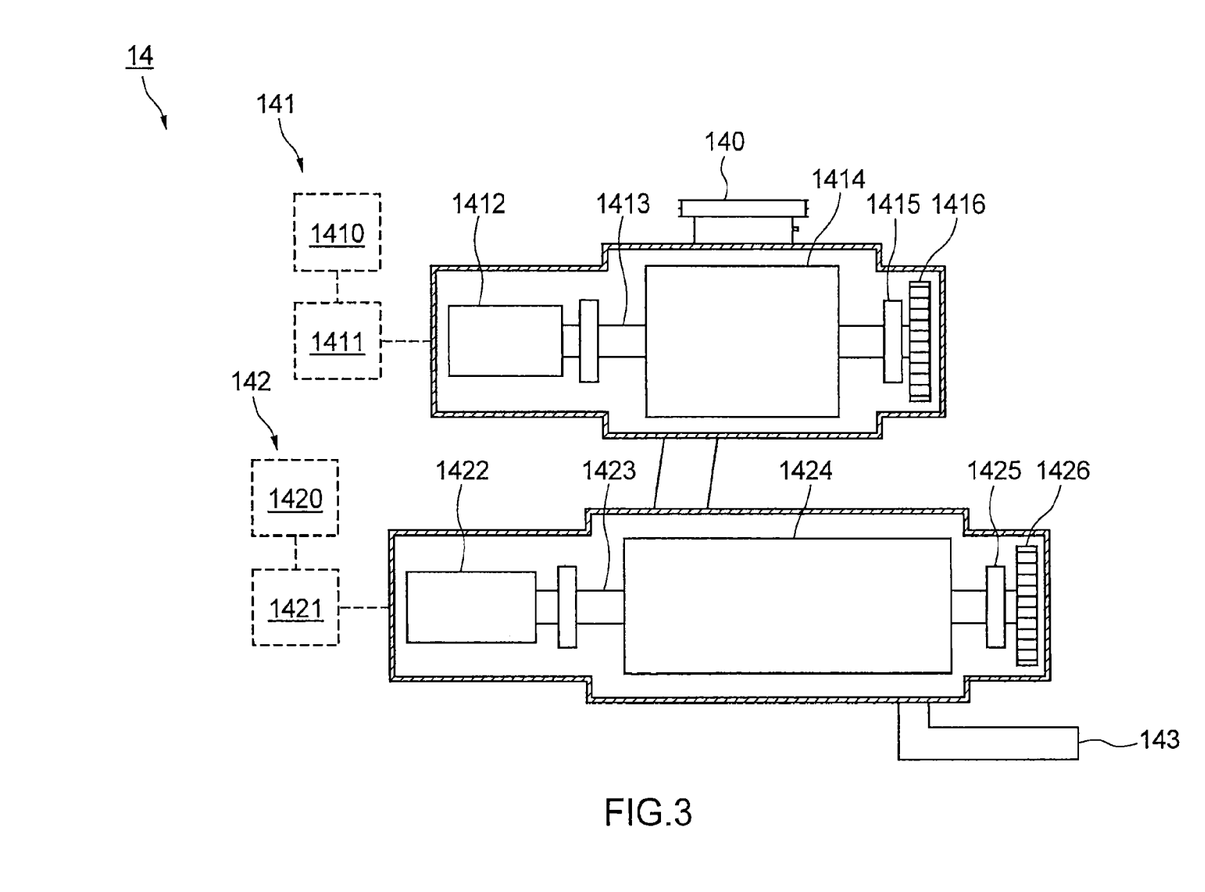
FIG. 3 is a schematic view of a pump 14 of the semiconductor manufacturing apparatus 1 in FIG. 1.

FIG. 1 is a schematic view of a semiconductor manufacturing apparatus 1 showing the first embodiment. FIG. 2 is a schematic perspective view of a mesh member 13 of the semiconductor manufacturing apparatus 1 in FIG. 1. FIG. 3 is a schematic view of a pump 14 of the semiconductor manufacturing apparatus 1 in FIG. 1.

The semiconductor manufacturing apparatus 1 in FIG. 1 is used, for example, for a film formation process in a semiconductor manufacturing process. The semiconductor manufacturing apparatus 1 includes a reactor 11, an exhaust pipe 12, a mesh member 13, and a pump 14 in this order from upstream of the gas in a flowing direction of the gas.

The reactor 11 houses a semiconductor substrate 2 (wafer) to treat the semiconductor substrate 2. Specifically, the reactor 11 in FIG. 1 is a hot-wall thermal CVD apparatus. The reactor 11 has a reacting furnace 111, a holder 112 and a gas feeder 113 arranged in the reacting furnace 111, and a heater 114 surrounding the reacting furnace 111. The holder 112, which is, for example, a vertical wafer board, holds a plurality of semiconductor substrates 2 stacked therein. The gas feeder 113, which includes, for example, a nozzle, discharges a source gas G1 fed from a gas source not shown to the semiconductor substrate 2. The heater 114 thermally decomposes the source gas G1 to generate a film formation species for carrying out the film formation on the semiconductor substrate 2.

Figure 4A:
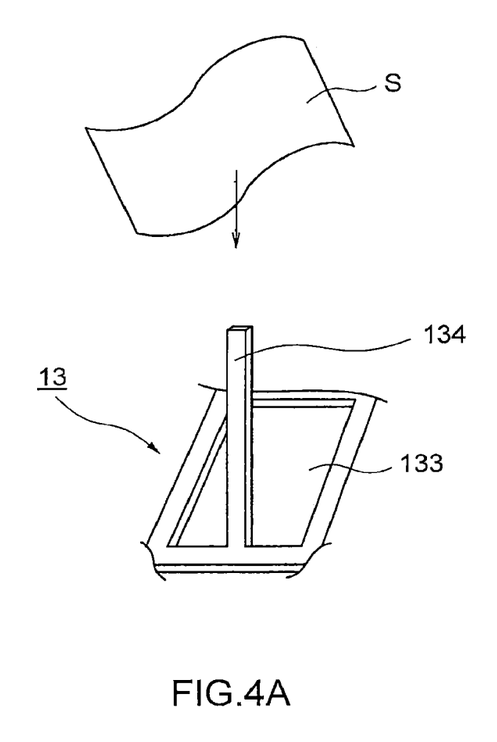
FIG. 4A is an illustration showing a foreign substance S flowing toward a protrusion 134 on the mesh member 13 in FIG. 2.
Figure 4B:
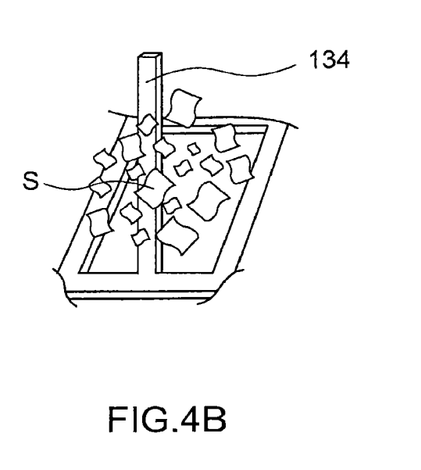
FIG. 4B is an illustration showing the foreign substance S broken by the protrusion 134.

The exhaust pipe 12 connects between the reacting furnace 111 (reactor 11) and the pump 14. The exhaust pipe 12 introduces a gas G2 inside the reacting furnace 111 via a suction power of the pump 14 to the mesh member 13. The gas G2 includes a foreign substance S such as a by-product caused by thermal CVD (see FIG. 4) in some cases. The foreign substance S is different depending on a kind of the source gas G1, and may be, for example, oxides (e.g., $SiO_2$), oxynitrides (e.g., SiON), or nitrides.

The mesh member 13 is located at a flow inlet (sucking inlet) 140 of the pump 14 for the gas G2 (see FIG. 3) such that the foreign substance S in the gas G2 is not sucked by the pump 14. The mesh member 13 may be located in the exhaust pipe 12.

As shown in FIG. 2, the mesh member 13 includes a front face 131 as a face upstream of the gas G2, a back face 132 as a face downstream of the gas G2, and a plurality of meshes (open holes) 133 penetrating between the front face 131 and the back face 132.

The front face 131 also serves as the main plane 131 of the mesh member 13 on which the plurality of meshes 133 are arranged. The front face 131 and the back face 132 are planes spread in a two-dimensional direction (horizontal direction). The mesh member 13 is located at the flow inlet 140 in the front face 131, and opens the flow inlet 140 through the mesh 133. A circumference of the mesh member 13 may be equal to or slightly less than an inner periphery of the flow inlet 140.

In addition, as shown in FIG. 2, the mesh member 13 includes a plurality of protrusions 134. The plurality of protrusions 134 project upstream of the gas G2 from the front face 131. The protrusion 134 may project in a vertical direction from the front face 131.

The mesh member 13 passes the gas G2 introduced from the exhaust pipe 12 through the mesh 133 to a side of the pump 14 to secure exhaust of the gas G2. On the other hand, the mesh member 13 traps the foreign substance S in the gas G2 on the front face 131 (in other words, retains, stops, or capture) to prevent the foreign substance S from entering the pump 14.

The protrusion 134 breaks the foreign substance S colliding with the protrusion 134 to reduce a size of the foreign substance S (split into small pieces). Reduction of the foreign substance size can prevent a foreign substance having a large size from entering the pump 14. Since the large-size foreign substance is prevented from entering the pump 14, the load on the pump 14 can be prevented from being raised.

Note, the mesh 133 may be formed by, for example, punching of a metal plate or the like. The protrusion 134 may be formed by, for example, bending of a metal plate, junction to the mesh member (e.g., welding or adhering) or the like.

The pump 14 suctions and exhausts the gas G2 inside the reacting furnace 111. Exhaust of the gas G2 can reduce a pressure within the reacting furnace 111.

As shown in FIG. 3, the pump 14 includes a booster pump 141, a main pump 142, and an exhaust outlet 143 in this order from upstream of the gas G2.

The booster pump 141 includes a motor controller 1410, a motor driver 1411, and a motor 1412. The booster pump 141 includes a main shaft 1413 directly connected with an output shaft of the motor 1412, a rotor 1414 rotating about the main shaft 1413, and a bearing 1415 and shaft stopper 1416 guiding rotation of the rotor 1414. Similarly, the main pump 142 includes a motor controller 1420, a motor driver 1421, a motor 1422, a main shaft 1423, a rotor 1424, a bearing 1425, and a shaft stopper 1426.

The booster pump 141 exhausts the reacting furnace 111 until a pressure under which the main pump 142 is operable is obtained. The main pump 142 reduces a pressure within the reacting furnace 111 to a predetermined pressure. In order to maintain a state where the pressure within the reacting furnace 111 is reduced, an exhaust path in the pump 14 is configured to be narrow. Due to the narrow exhaust path, the foreign substance S is likely to clog the pump 14. The motor controllers 1410 and 1420 control current (load) supplied (output) by the motor drivers 1411 and 1421 to the motors 1412 and 1422 so as to control rotations of the rotors 1414 and 1424, respectively. The motor controllers 1410 and 1420, which also serve as an interlock function, respectively stop the motors 1412 and 1422 (pump 14) once if the output currents from the motor drivers 1411 and 1421 exceed an upper limit value. The motor controllers 1410 and 1420 respectively drive again the motors 1412 and 1422 when a predetermined time period elapses after the motors 1412 and 1422 are stopped once.

Here, in a case where the film formation is carried out on the semiconductor substrate 2 having a larger surface area, an in-plane uniformity can be secured by increasing a feed amount of the source gas G1 as compared with a case where the film formation is carried out on the semiconductor substrate having a smaller surface area.

However, if the feed amount of the source gas G1 increases, an amount of the by-product adhered on the exhaust pipe increases, and thus, the foreign substance (by-product) peeled off from the exhaust pipe increases. At this time, for example, a large foreign substance also increases which has a size of the foreign substance of 5 mm square or more.

Then, when the foreign substance S having a larger size is suck by the pump 14, an exhaust capability of the pump 14 is lowered. Specifically, the larger foreign substance S catching in the rotors 1414 and 1424 interferes with (delays) the rotations of the rotors 1414 and 1424. For this reason, the motor controllers 1410 and 1420 considerably increase the output currents from the motor drivers 1411 and 1421 for maintaining rotating speeds of the rotors 1414 and 1424. The considerably increased output current exceeds the upper limit value with which the interlock function is activated. The output current exceeding the upper limit value causes the interlock function to be activated to stop the pump 14 once. The pump 14 stopped once is made considerably to be lowered in the exhaust capability even after returning.

Additionally, even if at all the larger foreign substance S is trapped on the front face 131 of the mesh member 13, the exhaust capability of the pump 14 is lowered. This is because the larger foreign substance S clogs the mesh 133 to reduce a cross-sectional area of a flow path of the gas G2 at the mesh member 13.

In contrast to this, in this embodiment, even if the film formation carried out on the semiconductor substrate 2 having a larger surface area with taking into account the in-plane uniformity (the feed amount of the source gas G1 is increased) results in the larger foreign substance S, the foreign substance S can be broken by the protrusion 134. Since the foreign substance S is broken to prevent the larger foreign substance S from being sucked by the pump 14, the exhaust capability of the pump 14 can be prevented from being lowered.

Next, a description is specifically given of an operation of the protrusion 134 with reference to FIG. 4A and FIG. 4B. FIG. 4A is an illustration showing the foreign substance S flowing toward the protrusion 134 on the mesh member 13 in FIG. 2. FIG. 4B is an illustration showing the foreign substance S broken by the protrusion 134.

The gas G2 inside the reacting furnace 111 having been used for the film formation flows to the flow inlet 140 together with the foreign substance S such as the by-product generated on the film formation by the suction power of the pump 14 (see FIG. 3).

The foreign substance S in the gas G2 collides with a tip of the protrusion 134 projecting upstream at the flow inlet 140 as shown in FIG. 4A.

The foreign substance S colliding with the protrusion 134, which is thin and brittle, is broken by the protrusion 134 to be reduced in size as shown in FIG. 4B.

Even if at all the foreign substance S reduced in size is sucked by the pump 14, the exhaust capability of the pump 14 is hard to be lowered. Specifically, even if the foreign substance S reduced in size catches in the rotors 1414 and 1424, the rotations of the rotors 1414 and 1424 are scarcely interfered (scarcely delayed). For this reason, the motor controllers 1410 and 1420 can maintain the rotating speeds (that is, the exhaust capabilities) of the rotors 1414 and 1424 by increasing the output currents from the motor drivers 1411 and 1421 to a certain degree. At this time, since each of the output currents from the motor drivers 1411 and 1421 is smaller than the upper limit value with which the interlock function is activated, the interlock function is not activated. Since the interlock function is not activated, lowering of the exhaust capability of the pump 14 can be prevented.

Moreover, the foreign substance S reduced in size, which has a size smaller than the mesh 133, does not clog the mesh 133. Since the mesh 133 is not clogged, lowering of the exhaust capability of the pump 14 can be further prevented.

Therefore, according to this embodiment, the protrusion 134 can split the foreign substance S into small pieces, which can reliably improve the exhaust capability of the pump 14 as compared with the related art. That is, according to this embodiment, surface area expansion of the semiconductor substrate 2, securement of the in-plane uniformity, and improvement in the exhaust capability of the pump 14 can be all achieved. Further, according to this embodiment, the improvement in the exhaust capability of the pump 14 can allow a lifetime of the pump 14 to be also improved.

First Modification Example

Next, as a first modification example of the first embodiment, a description is given of an example of a semiconductor manufacturing apparatus which includes a mesh member having the protrusions non-uniform in height. Note, in the description of the first modification example, components corresponding to the semiconductor manufacturing apparatus 1 in FIG. 1 are designated by the same reference signs and the duplicated description is omitted.

Figure 5:
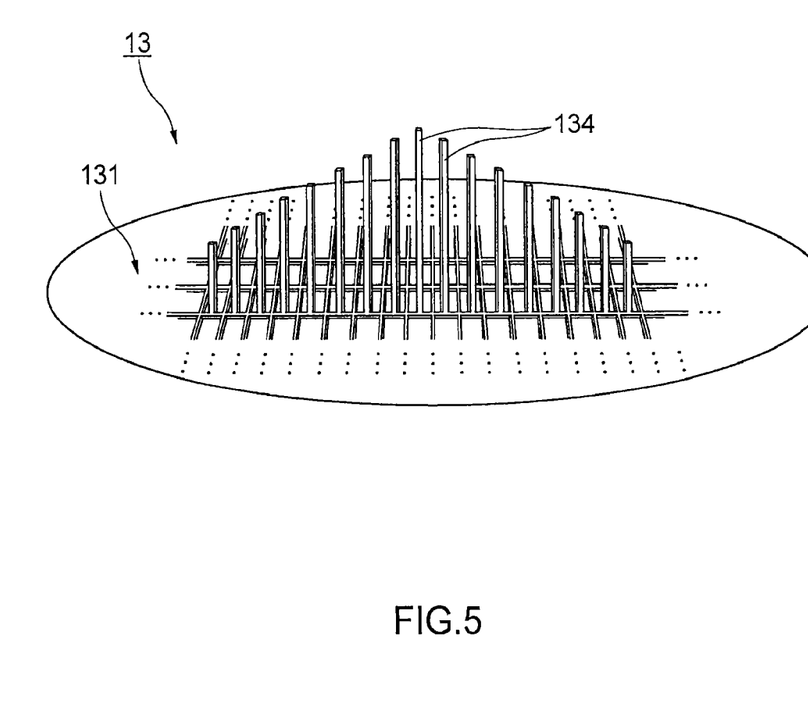
FIG. 5 is a schematic perspective view of the mesh member 13 showing a first modification example of the first embodiment.
Figure 6A:
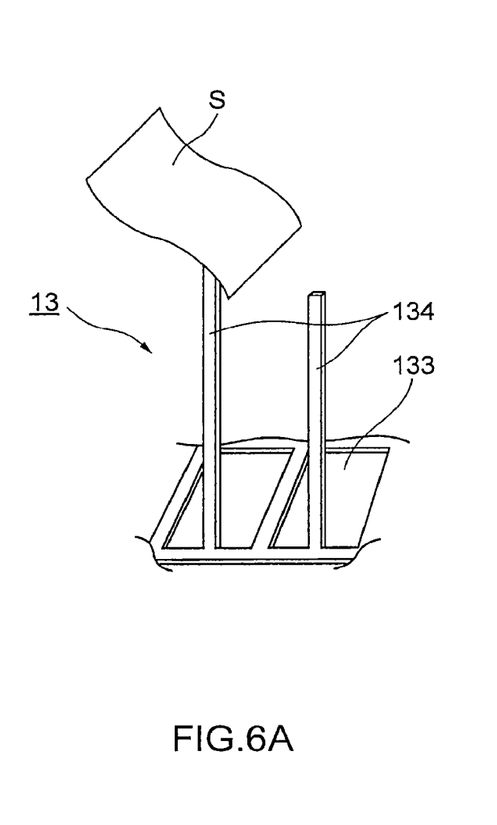
FIG. 6A is an illustration showing the foreign substance S not broken by the protrusion 134 on the mesh member 13 in FIG. 5.
Figure 6B:
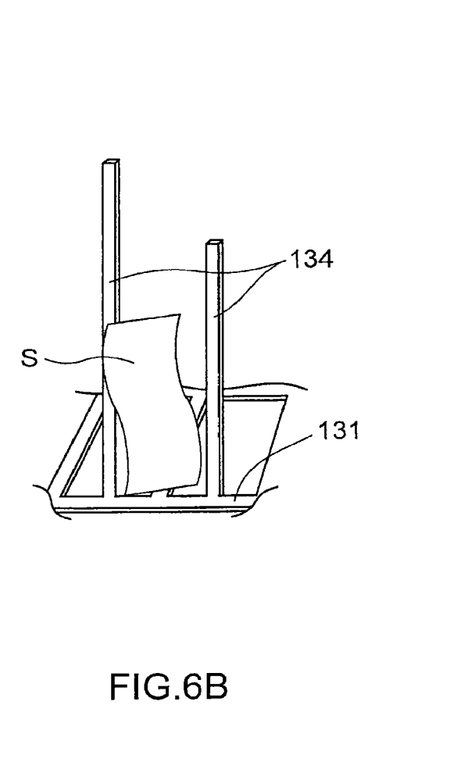
FIG. 6B is an illustration showing the foreign substance S caught between the protrusions 134.

FIG. 5 is a schematic perspective view of the mesh member 13 showing the first modification example of the first embodiment. FIG. 6A is an illustration showing the foreign substance S not broken by the protrusion 134 on the mesh member 13 in FIG. 5. FIG. 6B is an illustration showing the foreign substance S caught between the protrusions 134.

In the configuration in FIG. 2, the mesh member 13 has the protrusions 134 uniform in height (that is, a measure of the protrusion 134 in a surface normal direction of the front face 131). In contrast to this, the protrusions 134 in this modification example are non-uniform in height, as shown in FIG. 5.

In the first modification example, even in a case where the foreign substance S colliding with the protrusion 134 is exceptionally not broken, the exhaust capability of the pump 14 can be prevented from being lowered, as shown in FIG. 6A.

Specifically, as shown in FIG. 6B, the foreign substance S not broken by the protrusion 134 is, for example, caught between the protrusion 134 with which the foreign substance S collides and another protrusion 134 adjacent to this protrusion 134. The foreign substance S caught between the protrusions 134 adjacent to each other in this way is positioned on the front face 131 in a state of standing with respect to the mesh 133. The foreign substance S in the standing state in this way does not clog the mesh 133, unlike in the case of lying with respect to the mesh 133. Therefore, according to this modification example, even if at all the foreign substance is not broken by the protrusion 134, it is possible to prevent lowering of the exhaust capability caused by the foreign substance not broken.

Note a concrete aspect in which the protrusions 134 are made to be non-uniform in height is not specifically limited, but in terms of catching the foreign substance S between the protrusions 134 adjacent to each other, the protrusions 134 adjacent to each other preferably have heights different from each other.

Therefore, according to the first modification example, the exhaust capability of the pump 14 can be further improved.

Second Modification Example

Figure 7:
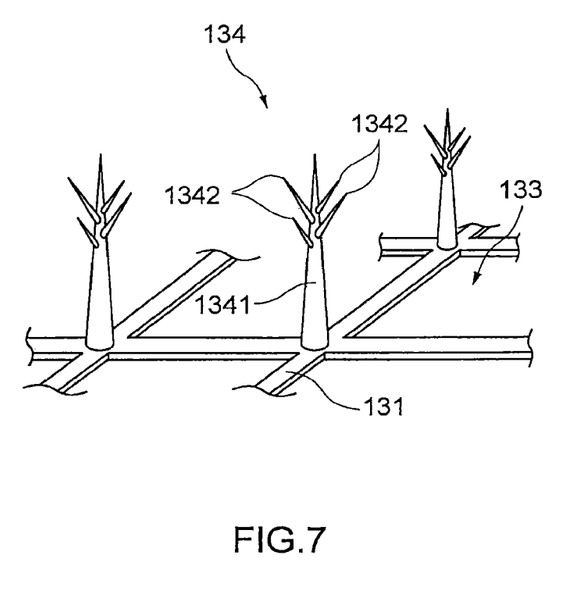
FIG. 7 is a schematic perspective view of the protrusion 134 showing a second modification example of the first embodiment.

Next, as a second modification example of the first embodiment, a description is given of a semiconductor manufacturing apparatus which includes a diverged protrusion. Note, in the description of the second modification example, components corresponding to the semiconductor manufacturing apparatus 1 in FIG. 1 are designated by the same reference signs and the duplicated description is omitted. FIG. 7 is a schematic perspective view of the protrusion 134 showing the second modification example of the first embodiment.

As shown in FIG. 7, the protrusion 134 in the second modification example has a first projection 1341 that is centered and large (long, and larger outer diameter), and a second projection 1342 that is small (short, and smaller outer diameter) and diverged from the first projection 1341 on a tip (upper end, upstream) side of the first projection 1341. The first projection 1341 projects upstream of the gas G2 (upper direction in FIG. 7). A plurality of the second projections 1342 are formed per one first projection 1341, and a projecting direction of each of the second projections 1342 inclines outward in a radial direction of the first projection 1341 with respect to a projecting direction of the first projection 1341. Additionally, the respective second projections 1342 may project in directions different from each other seen from the flowing direction of the gas G2.

According to the second modification example, the number of the projections can be efficiently increased on the front face 131 of the mesh member 13 an area of which is restricted. Increase in the number of the projections can improve an efficiency of breaking the foreign substance. Improvement in the efficiency of breaking the foreign substance can further improve the exhaust capability of the pump 14.

Second Embodiment

Next, as a second embodiment, a description is given of a semiconductor manufacturing apparatus which includes the mesh member having the protruding shape. Note, in the description of this embodiment, components corresponding to the first embodiment are designated by the same reference signs and the duplicated description is omitted.

Figure 8:
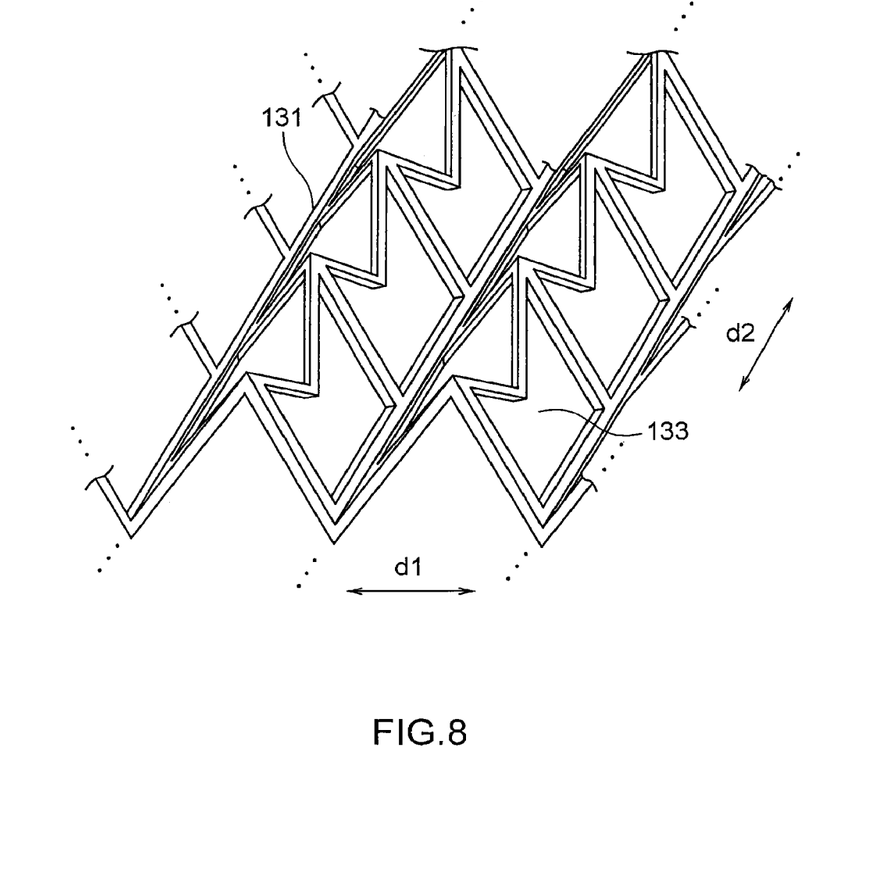
FIG. 8 is a schematic perspective view of the mesh member 13 showing a the second embodiment.

FIG. 8 is a schematic perspective view of the mesh member 13 showing the second embodiment. As shown in FIG. 8, the mesh member 13 in this embodiment is formed into the protruding shape, instead of including the protrusion 134. The protruding shape is a shape that the front face 131 of the mesh member 13 itself has. A concrete aspect of the protruding shape is not specifically limited, and, for example, the front face 131 of the mesh member 13 may be formed in a continuously mountain fold (valley fold) manner along directions d1 and d2 perpendicular to each other to have the protruding shape, as shown in FIG. 8.

According to this embodiment, since the foreign substance in the gas G2 can be broken by the protruding shape to be split into small pieces, the surface area expansion of the semiconductor substrate 2, the securement of the in-plane uniformity, and the improvement in the exhaust capability of the pump 14 can be all achieved, as are in the first embodiment.

Third Embodiment

Next, as a third embodiment, a description is given of a semiconductor manufacturing apparatus which includes the mesh member divided along the flowing direction of the gas. Note, in the description of this embodiment, components corresponding to the first embodiment are designated by the same reference signs and the duplicated description is omitted.

Figure 9:
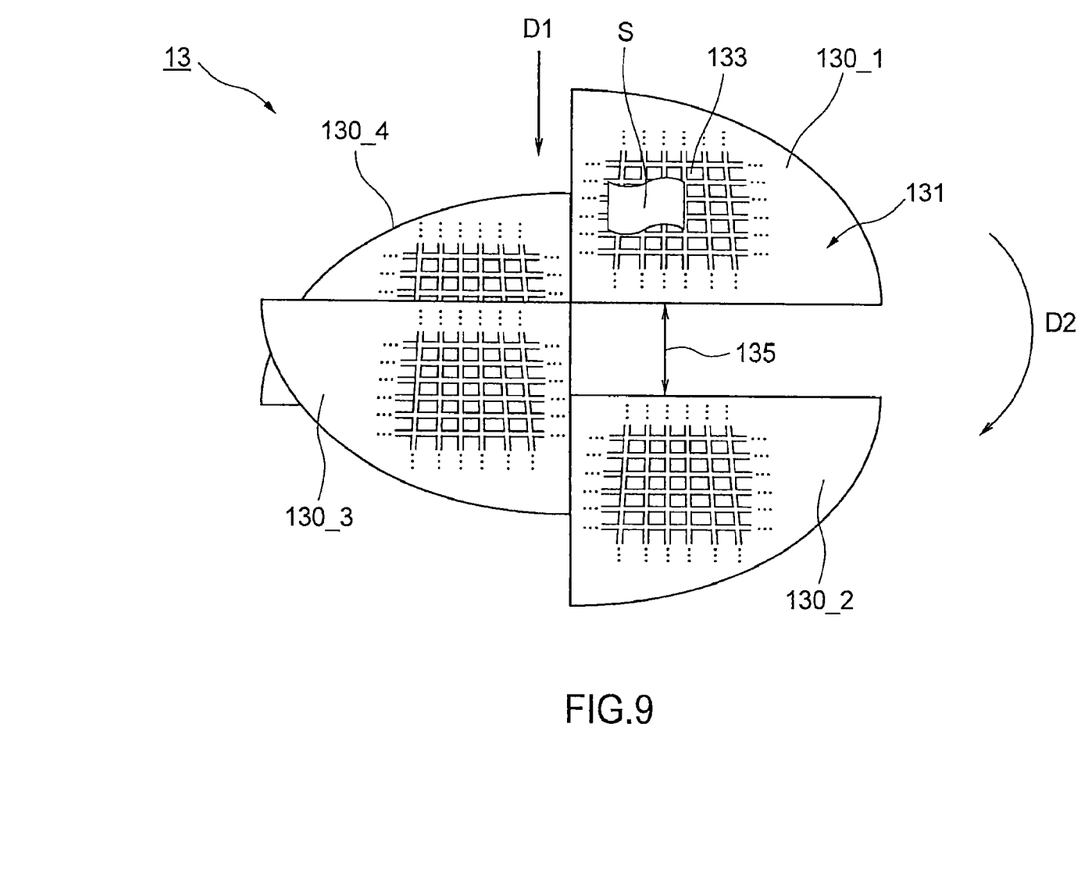
FIG. 9 is a schematic perspective view of the mesh member 13 showing a third embodiment.

FIG. 9 is a schematic perspective view of the mesh member 13 showing the third embodiment.

As shown in FIG. 9, the mesh member 13 in this embodiment is divided into plural pieces so as to make a gap 135 (opening, space) in a flowing direction D1 of the gas G2. In other words, the front face 131 of the mesh member 13 (main plane) is divided into plural divided faces so as to make the gap 135.

Specifically, the front face 131 of the mesh member 13 in FIG. 9 is divided into two pieces in the flowing direction D1 so as to make the gap 135 in the flowing direction D1. Each of two pieces obtained by dividing the front face 131 in the flowing direction D1 is further divided into two pieces in a circumferential direction D2 (direction perpendicular to the flowing direction D1). More specifically, the mesh member 13 includes fan-shaped first to fourth mesh parts 130_1 to 130_4.

The second mesh part 130_2 is positioned next to the first mesh part 130_1 in the circumferential direction D2 and at a distance of the gap 135 in the flowing direction D1 with respect to the first mesh part 130_1.

The third mesh part 130_3 has an angular interval of 90° with respect to the first mesh part 130_1 in the circumferential direction D2 and is placed at the same position as the first mesh part 130_1 in the flowing direction D1. The third mesh part 130_3 is positioned next to the second mesh part 130_1 in the circumferential direction D2 and at a distance of the gap 135 in the flowing direction D1 with respect to the second mesh part 130_1.

The fourth mesh part 130_4 is positioned next to the first mesh part 130_1 in the circumferential direction D2 and at a distance of gap 135 in the flowing direction D1 with respect to the first mesh part 130_1. The fourth mesh part 130_4 has an angular interval of 90° with respect to the second mesh part 130_2 in the circumferential direction D2 and is placed at the same position as the second mesh part 130_2 in the flowing direction D1. Moreover, the fourth mesh part 130_4 is positioned next to the third mesh part 130_3 in the circumferential direction D2 and at a distance of gap 135 in the flowing direction D1 with respect to the third mesh part 130_3.

The mesh member 13 in this embodiment can pass the gas G2 through the gap 135 along the flowing direction D1, which can prevent the exhaust capability from being lowered even if at all clogging of the mesh 133 occurs. In this embodiment, since a permissible limit for clogging of the mesh 133 can be raised, the size of the mesh 133 may be reduced to also improve trap efficiency for the foreign substance S.

Modification Example

Next, as a modification example of the third embodiment, a description is given of an example of a semiconductor manufacturing apparatus which include the divided mesh member having the protrusion. Note, In the description of this modification example, components corresponding to the semiconductor manufacturing apparatus 1 in FIG. 9 are designated by the same reference signs and the duplicated description is omitted.

Figure 10:
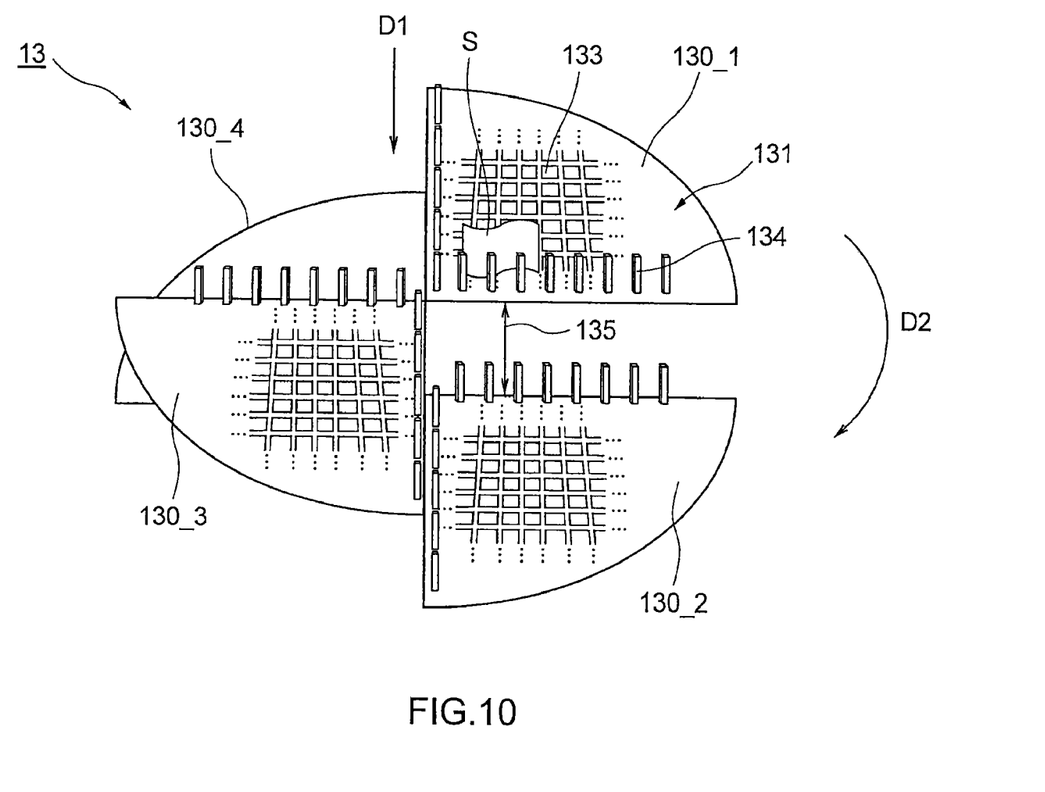
FIG. 10 is a schematic perspective view of the mesh member 13 showing a modification example of the third embodiment.

FIG. 10 is a schematic perspective view of the mesh member 13 showing the modification example of the third embodiment.

As shown in FIG. 10, the mesh member 13 in this modification example further includes, besides the configuration in FIG. 9, the protrusion 134 projecting upstream of the gas G2 on an end portion of the front face 131 (divided face) of each of the mesh parts 130_1 to 4 adjacent to the gap 135.

According to this modification example, in a case where the foreign substance S once trapped on the front face 131 is flowed to the gap 135 side with flow of the gas G2, the flowed foreign substance S can be poked with the projection part 134 to be stopped. This can prevent the foreign substance S from entering the gap portion 135, preventing the foreign substance S from intruding into the pump 14 through gap 135.

That is, according to this modification example, the exhaust capability can be further effectively prevented from being lowered.

Note, in FIG. 9 and FIG. 10, any two mesh parts adjacent to each other in the circumferential direction D2 (for example, the first mesh part 130_1 and the second mesh part 130_2) may have the end portions of the front faces 131 (divided faces) adjacent to the gap 135 overlapped with each other in the flowing direction D1. In other words, the plural divided faces may be arranged such that the end portions of the respective divided faces adjacent to the gap 135 are overlapped with each other in the flowing direction D1.

This can further prevent the foreign substance S from flowing to gap 135, further effectively preventing the exhaust capability from being lowered.

Moreover, as is in the cases in FIG. 2, FIG. 5, and FIG. 7, the protrusions 134 may be formed across the entire plane (wider range) of the front face 131 of each of the mesh parts 130_1 to 4. Further, as is in the case in FIG. 8, the front face 131 itself of each of the mesh parts 130_1 to 4 may be formed into the protruding shape. The protrusion 134 or the protruding shape is included to be able to break the foreign substance. Breaking of the foreign substance can further effectively prevent the exhaust capability of the pump 14 from being lowered.

In addition to the above configurations, a configuration in adequate combinations of the first to third embodiments may be used. For example, the mesh member 13 may include both the protrusion 134 and the protruding shape. Additionally, the plural protruding shapes may be non-uniform in height.

Further, this embodiment may be applied to not only a batch-type thermal CVD apparatus but also a sheet-type thermal CVD apparatus or a plasma CVD apparatus.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
    a reactor that houses a semiconductor substrate to treat the semiconductor substrate;
    a pump that exhausts a gas inside the reactor;
    an exhaust pipe that connects between the reactor and the pump; and
    a mesh member that is located at a flow inlet of the pump for the gas or in the exhaust pipe and is divided into two pieces arranged on different planes separated by a gap in a flowing direction of the gas, each of the two pieces including two mesh parts arranged at angular intervals of ninety degrees in a circumferential direction of the mesh member and separated by gaps in the circumferential direction,
    the mesh member comprises a plurality of protrusions, the protrusions projecting on an upstream side of each mesh part in the flowing direction of the gas and aligning with the flowing direction of the gas, the protrusions being formed one or more on the outer periphery of each mesh part, and
    the mesh parts on the different planes are overlapped with each other at end portions thereof and not overlapped at inner areas thereof, when the mesh parts are viewed from the flowing direction of the gas, and the mesh parts have a fan shape when viewed from the flowing direction of the gas.

2. The semiconductor manufacturing apparatus according to claim 1, wherein the mesh member has a circular shape when viewed from the flowing direction of the gas.

* * * * *